United States Patent
Jeong et al.

(10) Patent No.: US 9,905,794 B2
(45) Date of Patent: Feb. 27, 2018

(54) DISPLAY DEVICE AND AUTOMOBILE INCLUDING THE SAME

(71) Applicant: Samsung Display Co., Ltd., Yongin-si, Gyeonggi-do (KR)

(72) Inventors: Cheolyun Jeong, Yongin-si (KR); Kinyeng Kang, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/254,784

(22) Filed: Sep. 1, 2016

(65) Prior Publication Data

US 2017/0101013 A1    Apr. 13, 2017

(30) Foreign Application Priority Data

Oct. 13, 2015   (KR) .......................... 10-2015-0143046

(51) Int. Cl.
*H01L 51/52* (2006.01)
*H01L 51/00* (2006.01)

(52) U.S. Cl.
CPC ...... *H01L 51/5237* (2013.01); *H01L 51/0097* (2013.01); *H01L 51/529* (2013.01)

(58) Field of Classification Search
CPC . H01L 51/5237; H01L 51/52; H01L 51/0097; H05K 7/20
USPC .................. 361/717, 704; 257/100; 313/512
See application file for complete search history.

(56) References Cited

U.S. PATENT DOCUMENTS

| | | | | |
|---|---|---|---|---|
| 6,067,230 | A * | 5/2000 | Ashida | H05K 7/20509 165/80.3 |
| 2005/0117293 | A1* | 6/2005 | Yokoyama | H01L 51/5243 361/688 |
| 2011/0050657 | A1* | 3/2011 | Yamada | H01L 27/3293 345/204 |
| 2011/0114993 | A1* | 5/2011 | Lee | H01L 51/003 257/100 |
| 2014/0085832 | A1* | 3/2014 | Matsubara | H05K 7/20445 361/722 |
| 2014/0218617 | A1* | 8/2014 | Hongo | H04N 5/64 348/725 |

FOREIGN PATENT DOCUMENTS

| | | |
|---|---|---|
| JP | 2014-91489 A | 5/2014 |
| KR | 10-2010-0056681 A | 5/2010 |
| KR | 10-2011-0039794 A | 4/2011 |
| KR | 10-2014-0122933 A | 10/2014 |

* cited by examiner

*Primary Examiner* — Dion R Ferguson
*Assistant Examiner* — Mandeep S Buttar
(74) *Attorney, Agent, or Firm* — Knobbe, Martens, Olson & Bear, LLP

(57) ABSTRACT

A display device for a vehicle and an automobile including the same are disclosed. In one aspect, the display device includes a display unit that includes a first surface and a second surface located on an opposite side of the first surface. The first surface includes an active area having opposing sides and configured to generate an image and a plurality of inactive areas located on the opposing sides of the active area and bent with respect to the active area. The display device also includes a heat radiation member adjacent to the second surface of the display unit.

18 Claims, 8 Drawing Sheets

DISPLAY DEVICE AND AUTOMOBILE INCLUDING THE SAME

CROSS-REFERENCE TO RELATED APPLICATIONS

This application claims the benefit of Korean Patent Application No. 10-2015-0143046, filed on Oct. 13, 2015, in the Korean Intellectual Property Office, the disclosure of which is incorporated herein in its entirety by reference.

BACKGROUND

Field

The described technology generally relates to a display device and an automobile including the same.

Description of the Related Technology

A display device such as an organic light-emitting diode (OLED) display is used in mobile devices such as smartphones, tablet computers, ultra-slim laptop computers, digital cameras, video cameras, and personal digital assistants (PDAs), or large consumer electronics devices such as ultra-thin televisions.

As flexibility of display devices increases, market demand for utilizing the devices in various fields, for example, an automobile field, a medical field, a clothing field, etc. also increases.

SUMMARY OF CERTAIN INVENTIVE ASPECTS

One inventive aspect relates to a display device for a vehicle, and a structure that may effectively radiate or dissipate heat generated from a display unit.

Another aspect is a display device for a vehicle that includes: a display unit including a first surface, and a second surface located on an opposite side of the first surface, wherein the first surface includes an active area that provides an image and dead areas located on both sides of the active area and bent with respect to the active area; and a heat radiation member adjacent to the second surface of the display device and including a metallic material.

The heat radiation member may include: a first heat radiation portion including a first plate facing the second surface of the display device and a plurality of first heat radiation pins that protrude from the first plate; and a second heat radiation portion including a second plate parallel to the first plate and a plurality of second heat radiation pins that protrude from the second plate.

The first heat radiation pins and the second heat radiation pins may extend along a direction away from the second surface of the display device.

The plurality of first heat radiation pins may directly contact the second plate.

The first heat radiation portion may further include: a first opposite plate parallel to the first plate to form a space between the first plate and the first opposite plate; and a pair of first side plates configured to connect the first plate with the first opposite plate.

The first heat radiation portion may further include: a plurality of heat radiation pins located on an inner surface of at least one of the first opposite plate and the pair of first side plates.

The second heat radiation portion may further include: a second opposite plate parallel to the second plate to form a space between the second plate and the second opposite plate; and a pair of second side plates configured to connect the second plate with the second opposite plate.

The second heat radiation portion may further include: a plurality of heat radiation pins located on an inner surface of at least one of the second opposite plate and the pair of second side plates.

The first plate may have a first width along a first direction and a first length along a second direction different from the first direction, the second plate may have a second width along the first direction and a second length along the second direction, and the first width may be greater than the second width, and the first length may be less than the second length.

The heat radiation member may include a porous metallic plate.

The display device may include an OLED display having flexibility.

Another aspect is an automobile that includes: a car body defining an indoor space; and a display apparatus for a vehicle provided to the indoor space, wherein the display apparatus for the vehicle includes: a display device including a first surface, and a second surface located on an opposite side of the first surface, wherein the first surface includes an active area that provides an image and dead areas located on both sides of the active area and bent with respect to the active area; and a heat radiation member adjacent to the second surface of the display device and including a metallic material.

The display apparatus for the vehicle may be located on a dashboard.

The car body may further include a metallic panel provided to a part space spatially separated from the indoor space, and the heat radiation member may be thermally connected with the metallic panel.

The heat radiation member may include: a first heat radiation portion including a first plate facing the second surface of the display device and a plurality of first heat radiation pins that protrude from the first plate; and a second heat radiation portion including a second plate parallel to the first plate and a plurality of second heat radiation pins that protrude from the second plate, wherein the plurality of first heat radiation pins may directly contact the second plate.

The first heat radiation portion may further include: a first opposite plate parallel to the first plate to form a space between the first plate and the first opposite plate; and a pair of first side plates configured to connect the first plate with the first opposite plate, and the second heat radiation portion may further include: a second opposite plate parallel to the second plate to form a space between the second plate and the second opposite plate; and a pair of second side plates configured to connect the second plate with the second opposite plate.

The first heat radiation portion may further include: a plurality of heat radiation pins located on an inner surface of at least one of the first opposite plate and the pair of first side plates.

The second heat radiation portion may further include: a plurality of heat radiation pins located on an inner surface of at least one of the second opposite plate and the pair of second side plates.

The automobile may further include: an air blower configured to control a flow speed of air passing through the heat radiation member.

The heat radiation member may include a porous metallic plate.

Another aspect is a display device for a vehicle, the device comprising: a display unit comprising a first surface and a second surface located on an opposite side of the first surface, wherein the first surface includes i) an active area having opposing sides and configured to generate an image and ii) a plurality of inactive areas located on the opposing sides of the active area and bent with respect to the active area; and a heat radiation member adjacent to the second surface of the display unit.

In the above device, the heat radiation member comprises: a first heat radiation portion comprising a first plate facing the second surface of the display unit and a plurality of first heat radiation pins that protrude from the first plate; and a second heat radiation portion comprising a second plate parallel to the first plate and a plurality of second heat radiation pins that protrude from the second plate.

In the above device, the first and second heat radiation pins extending away from the second surface of the display unit.

In the above device, the first heat radiation pins directly contact the second plate.

In the above device, the first heat radiation portion further comprises: a first opposite plate parallel to the first plate to form a first space between the first plate and the first opposite plate; and a pair of first side plates configured to connect the first plate and the first opposite plate.

In the above device, each of the first opposite plate and the pair of first side plates has an inner surface, wherein the first heat radiation portion further comprises a plurality of heat radiation pins located on the inner surface of at least one of the first opposite plate and the pair of first side plates.

In the above device, the second heat radiation portion further comprises: a second opposite plate parallel to the second plate to form a second space between the second plate and the second opposite plate; and a pair of second side plates configured to connect the second plate and the second opposite plate.

In the above device, each of the second opposite plate and the pair of second side plates has an inner surface, wherein the second heat radiation portion further comprises a plurality of heat radiation pins located on the inner surface of at least one of the second opposite plate and the pair of second side plates.

In the above device, the first plate has a first width defined along a first direction and a first length along a second direction different from the first direction, wherein the second plate has a second width defined along the first direction and a second length defined along the second direction, wherein the first width is greater than the second width, and wherein the first length is less than the second length.

In the above device, the heat radiation member comprises a porous metallic plate.

In the above device, the display unit comprises a flexible organic light-emitting diode display.

Another aspect is an automobile comprising: a car body defining an indoor space; and a display device formed in the indoor space. The display device comprises: a display unit comprising a first surface and a second surface located on an opposite side of the first surface, wherein the first surface includes an i) active area having opposing sides and configured to generate an image and ii) a plurality of inactive areas located on the opposing sides of the active area and bent with respect to the active area; and a heat radiation member adjacent to the second surface of the display unit.

The above automobile further comprises a dashboard in the indoor space, wherein the display device is located on the dashboard.

In the above automobile, the car body further comprises i) a front portion defining a part space spatially separated from the indoor space and ii) a metallic panel included in the part space, wherein the heat radiation member is thermally connected to the metallic panel.

In the above automobile, the heat radiation member comprises: a first heat radiation portion comprising a first plate facing the second surface of the display unit and a plurality of first heat radiation pins that protrude from the first plate; and a second heat radiation portion comprising a second plate parallel to the first plate and a plurality of second heat radiation pins that protrude from the second plate, wherein the first heat radiation pins directly contact the second plate.

In the above automobile, the first heat radiation portion further comprises: a first opposite plate parallel to the first plate to form a first space between the first plate and the first opposite plate; and a pair of first side plates configured to connect the first plate and the first opposite plate. The second heat radiation portion further comprises: a second opposite plate parallel to the second plate to form a second space between the second plate and the second opposite plate; and a pair of second side plates configured to connect the second plate and the second opposite plate.

In the above automobile, each of the first opposite plate and the pair of first side plates has an inner surface, wherein the first heat radiation portion further comprises a plurality of heat radiation pins located on the inner surface of at least one of the first opposite plate and the pair of first side plates.

In the above automobile, each of the second opposite plate and the pair of second side plates has an inner surface, wherein the second heat radiation portion further comprises a plurality of heat radiation pins located on the inner surface of at least one of the second opposite plate and the pair of second side plates.

The above automobile further comprises an air blower configured to control a flow speed of air passing through the heat radiation member.

In the above automobile, the heat radiation member comprises a porous metallic plate.

According to at least one of the disclosed embodiments, a display device for a vehicle and an automobile including the same may effectively radiate or dissipate heat generated from a display device and thus improve durability of the display device.

DETAILED DESCRIPTION OF CERTAIN INVENTIVE EMBODIMENTS

Figure 1:
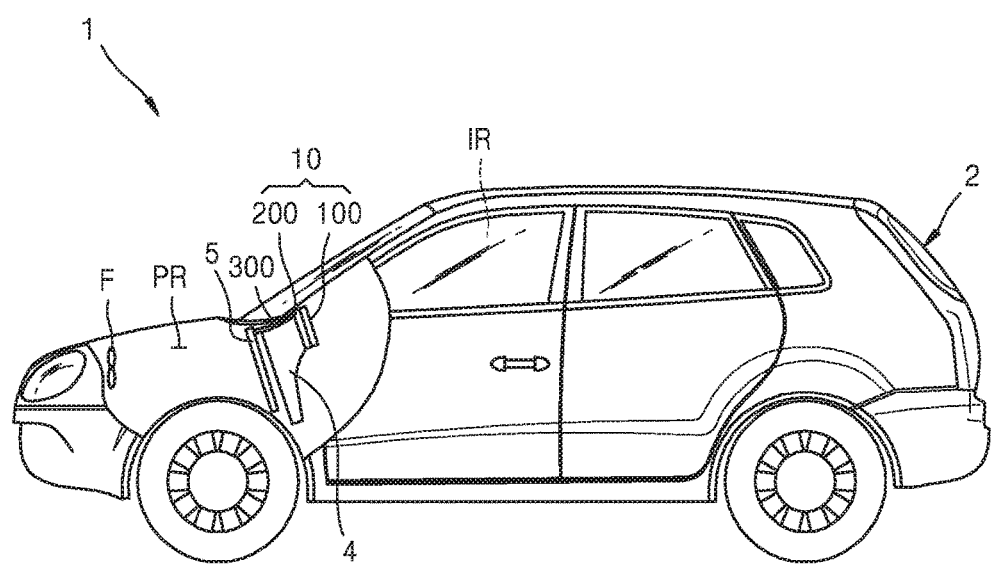
FIG. 1 is a side view illustrating an automobile according to an exemplary embodiment.

As the described technology allows for various changes and numerous embodiments, exemplary embodiments will be illustrated in the drawings and described in detail in the written description. Effects and characteristics of present exemplary embodiments, and a method of accomplishing them will be apparent by referring to content described below in detail together with the drawings. However, the present exemplary embodiments are not limited to exemplary embodiments below and may be implemented in various forms.

Expressions such as "at least one of" when preceding a list of elements, modify the entire list of elements and do not modify the individual elements of the list.

Hereinafter, the described technology will be described more fully with reference to the accompanying drawings, in which exemplary embodiments are shown. When description is made with reference to the drawings, like reference numerals in the drawings denote like or corresponding elements, and repeated description thereof will be omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
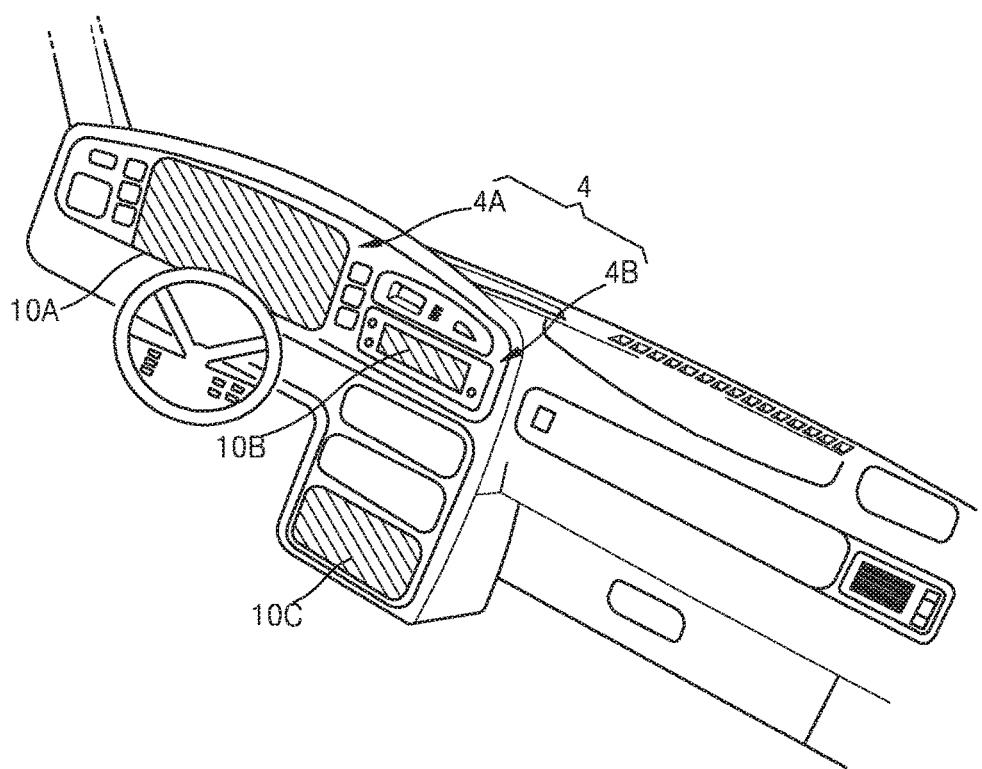
FIG. 2 is a view illustrating a portion of an inside of an automobile according to an exemplary embodiment.

FIG. 1 is a side view illustrating an automobile 1 according to an exemplary embodiment, FIG. 2 is a view illustrating a portion of an inside of the automobile 1 according to an exemplary embodiment. FIG. 1 omits a portion of a frame of the front of the automobile, for convenience of description.

Referring to FIGS. 1 and 2, the automobile 1 includes a car body 2 defining an indoor space IR which forms an appearance and which a driver gets on. A display device 10 for a vehicle (referred to as a display device) according to an exemplary embodiment may be located on a dashboard 4. According to an exemplary embodiment, a display device 10A may be located on an instrument panel 4A and provide velocity information, etc. to a driver. According to another exemplary embodiment, display devices 10B and 10C may be located on a center fascia 4B and provide map information, music information, etc.

The display device 10 includes a display unit 100 and a heat radiation member 200. The heat radiation member 200 may be thermally connected to a metallic panel 5 provided to the automobile by using a connection member (or connector) 300. For example, the metallic panel 5 is a member provided to a part space PR in which an engine is received and supporting the engine, etc., or a portion of a lower frame forming a car body 2. The connection member 300 extending from the heat radiation member 200 directly contacts the metallic panel 5, so that heat absorbed by the heat radiation member 200 may be transferred to the metallic panel 5 via way of the connection member 300.

The display unit 100 of the display device 10 may be an OLED display having flexibility as described below with reference to FIG. 4. An OLED included in the OLED display has a characteristic of being deteriorated rapidly under a high temperature environment rather than a low temperature environment. Deterioration of the OLED display may be prevented by a temperature adjustment unit, for example, an air conditioner provided to the automobile 1 during an operation of the automobile 1. However, while the automobile 1 is parked the temperature of the indoor space IR of the automobile 1 can increase and the OLED display can deteriorate.

However, since the display device 10 includes the heat radiation member 200, deterioration of the display unit 100 due to a temperature increase of the indoor space IR of the automobile 1 may be prevented.

Also, since the heat radiation member 200 is thermally connected to the metallic panel 5 by using the connection member 300, the heat radiation member 200 absorbs heat but the heat may be transferred to the metallic panel 5 via the connection member 300. The heat may be radiated or dissipated via the metallic panel 5 having a large heat capacity compared to that of the heat radiation member 200 and/or may be effectively radiated or dissipated by a fan F for cooling the engine inside the part space PR in which the metallic panel 5 is provided. According to an exemplary embodiment, the temperature of the indoor space IR of the automobile 1 may be relatively high and the temperature of an external space (for example, the part space PR) may be relatively low. The heat radiation member 200 absorbs heat but the heat may be effectively radiated via the metallic panel 5 provided to the part space PR which is relatively low temperature.

A specific structure of the display device 10 is described below with reference to FIGS. 3 to 8.

Figure 3:
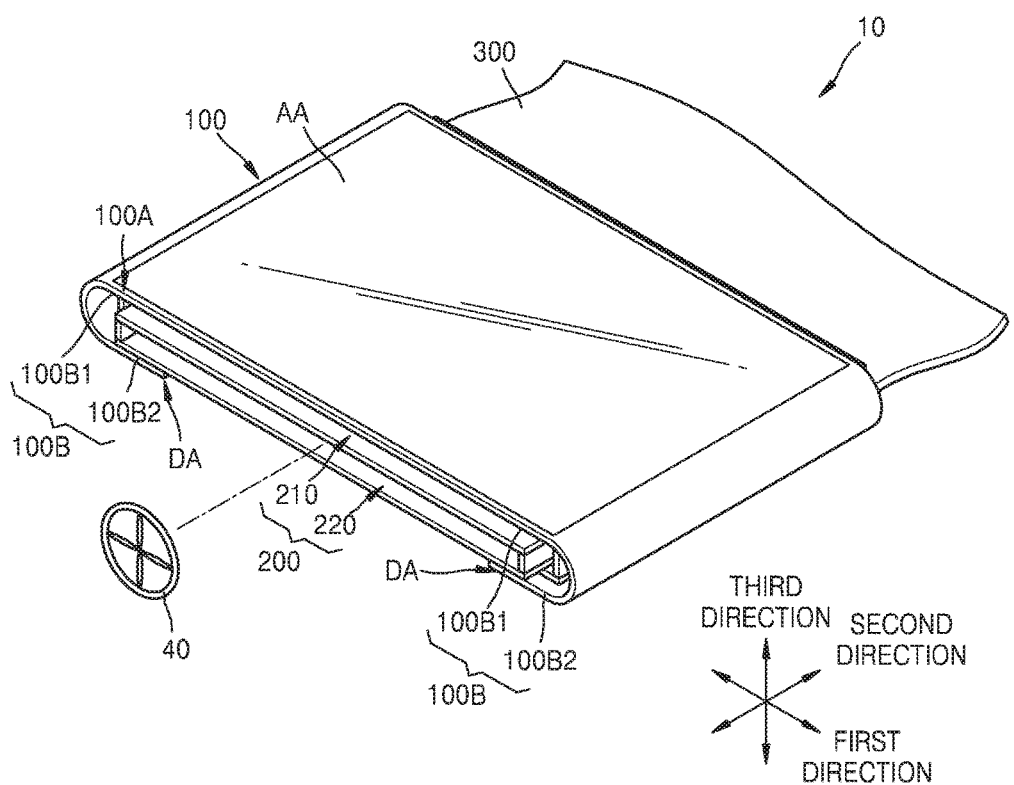
FIG. 3 is a perspective view illustrating a display device for a vehicle according to an exemplary embodiment.
Figure 5:
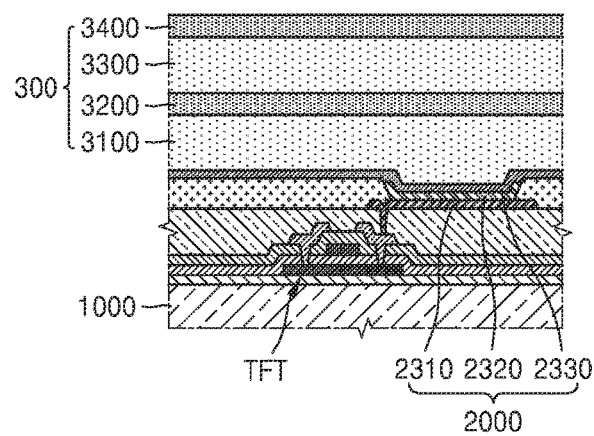
FIG. 5 is a cross-sectional view illustrating a portion of an active area of FIG. 4, taken along a line V-V.
Figure 6:
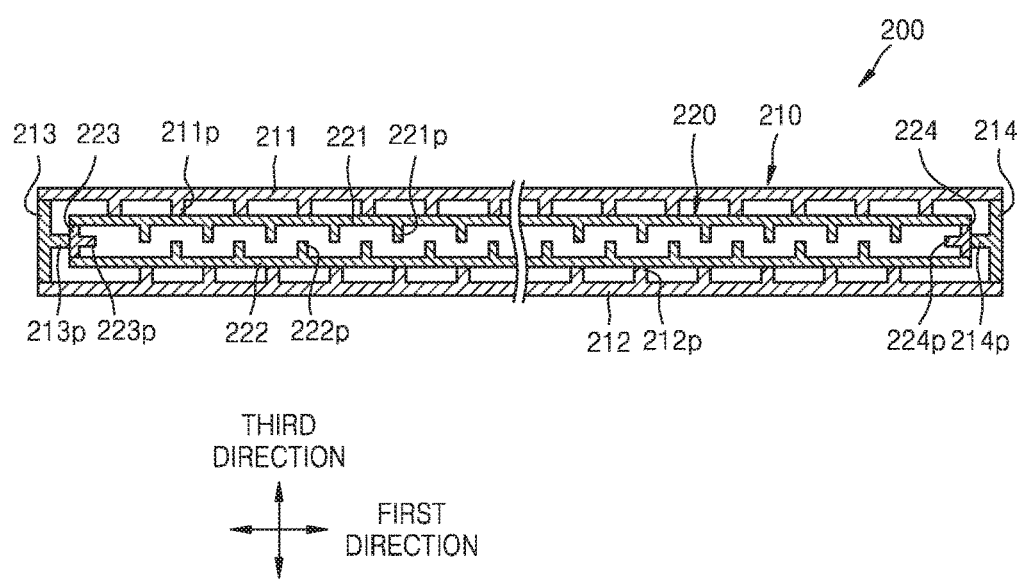
FIG. 6 is a cross-sectional view taken along a line VI-VI of FIG. 4.

FIG. 3 is a perspective view illustrating the display device 10 for a vehicle according to an exemplary embodiment. FIG. 4 is an exploded perspective view of the display device 10 for the vehicle of FIG. 3. FIG. 5 is a cross-sectional view illustrating a portion of an active area of FIG. 4, taken along a line V-V. FIG. 6 is a cross-sectional view taken along a line VI-VI of FIG. 4.

Figure 4:
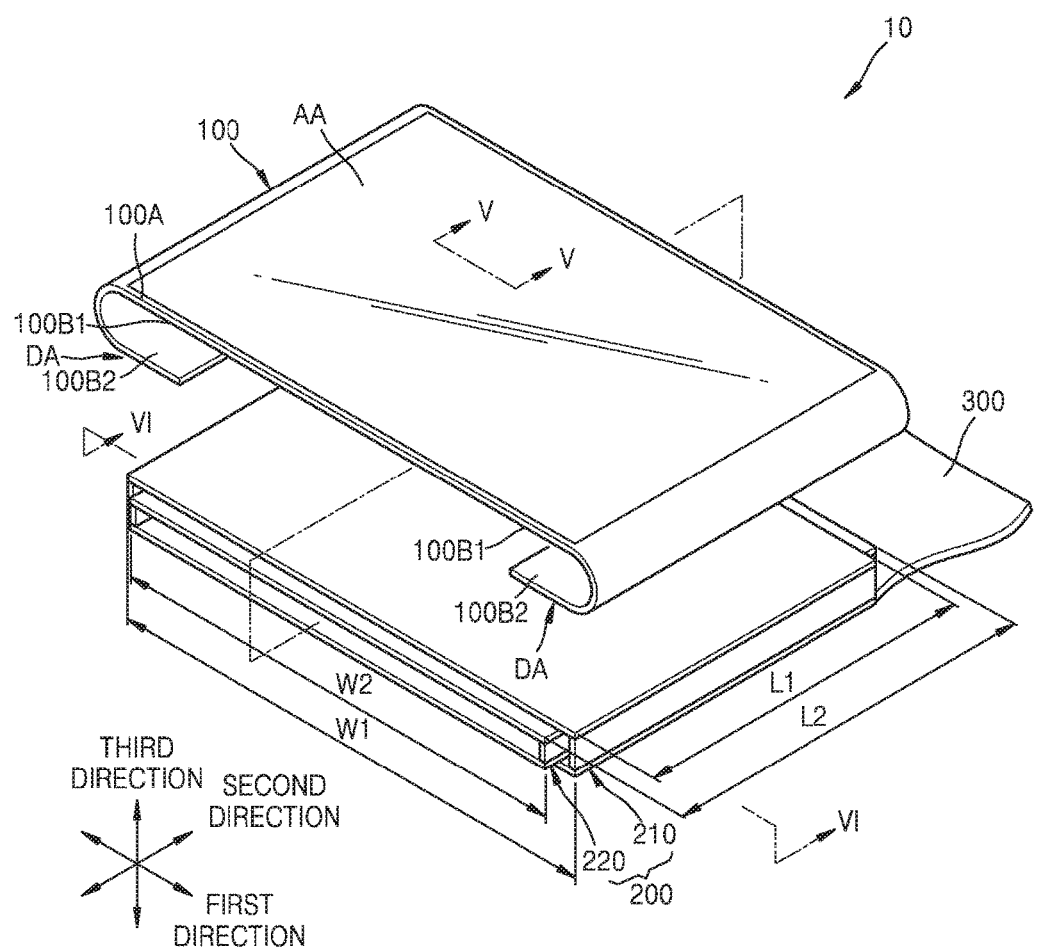
FIG. 4 is an exploded perspective view of the display device for the vehicle of FIG. 3.

Referring to FIGS. 3 and 4, the display device 10 includes the display unit 100 and the heat radiation member 200. The connection member 300 may be provided on one side of the heat radiation member 200.

The display unit 100 has flexibility. The display unit 100 includes an active area AA and dead areas DA located on both sides of the active area AA and bent with respect to the active area AA. Pixels may be provided in the active area AA and provide an image. The display unit 100 may be an OLED display as described above, and each pixel includes an OLED 2000 as illustrated in FIG. 5.

Referring to FIG. 5, the display unit 100 includes the OLED 2000 and a thin film encapsulation layer 3000 on a substrate 1000.

The substrate 1000 may include a plastic material having flexibility. For example, the substrate 1000 is formed of polyethersulphone (PES), polyacrylate (PAR), polyetherimide (PEI), polyethyelenen naphthalate (PEN), polyethyeleneterepthalate (PET), polyphenylene sulfide (PPS), polyallylate, polyimide, polycarbonate (PC), cellulose triacetate (TAC), cellulose acetate propionate (CAP), etc.

A thin film transistor (TFT) and the OLED 2000 electrically connected to the TFT are located on the substrate 1000. The OLED 2000 may include a pixel electrode 2310, an intermediate layer 2320, and an opposite electrode 2330. The intermediate layer 2320 may include an emission layer formed of a low molecular organic material or a polymer organic material. The intermediate layer 2320 may further selectively include a functional layer such as a hole transparent layer (HTL), a hole injection layer (HIL), an electron transport layer (ETL), and an electron injection layer (EIL).

The thin film encapsulation layer 3000 may include one or more organic layers 3100 and 3300, and one or more inorganic layers 3200 and 3400. The one or more organic layers 3100 and 3300, and the one or more inorganic layers 3200 and 3400 may be stacked alternately. Though FIG. 5 illustrates an example in which the thin film encapsulation layer 3000 includes the two inorganic layers 3200 and 3400 and the two organic layers 3100 and 3300, the described technology is not limited thereto. That is, the thin film encapsulation layer 3000 may further include a plurality of alternately disposed additional inorganic layers and organic layers, and a number of the stacked inorganic layers and organic layers is not limited.

Referring to FIGS. 3 and 4 again, a driving driver (not shown) for driving pixels provided in the active area AA and wirings (not shown) connecting the pixels may be located in the dead area DA of the display unit 100.

The dead areas DA are bent with respect to the active area AA. According to an exemplary embodiment, the display unit 100 includes a first surface 100A (or a front surface) providing an image displayed via the pixels of the active area AA, and a second surface 100B (or a rear surface) provided to an opposite side of the first surface 100A. The dead areas DA may be bent so that a portion 100B 1 of the second surface 100B that corresponds to the active area AA may face portions 100B2 of the second surface 100B that correspond to the dead areas DA.

Though FIGS. 3 and 4 illustrate the case where the dead areas DA are bent to be substantially parallel to the active area AA, the described technology is not limited thereto. According to another exemplary embodiment, the dead areas DA may be bent to substantially form a right angle or an acute angle with the active area AA.

The heat radiation member 200 is thermally connected to the second surface 100B of the display unit 100. According to an exemplary embodiment, the heat radiation member 200 may directly contact the second surface 100B of the display unit 100, for example, the portion 100B1 of the second surface 100B that corresponds to the active area AA. According to another exemplary embodiment, a heat conductive adhesive layer (not shown) may be further disposed between the heat radiation member 200 and the second surface 100B of the display unit 100, for example, the portion 100B 1 of the second surface 100B that corresponds to the active area AA.

The heat radiation member 200 may be formed of a metallic material such as aluminum and silver, or an insulating material such as a heat conductive plastic.

The heat radiation member 200 may have a structure in which a plurality of heat radiation portions, for example, a first heat radiation portion 210 and a second heat radiation portion 220 overlap each other. For example, as illustrated in FIGS. 3, 4, and 6, the heat radiation member 200 may have an overlapped structure in which the second heat radiation portion 220 is located inside the first heat radiation portion 210.

The first heat radiation portion 210 may include a first plate 211 facing the second surface 100B of the display unit 100, a first opposite plate 212 parallel to the first plate 211 to form a space between the first plate 211 and the first opposite plate 212, and a pair of side plates 213 and 214 connecting the first plate 211 with the first opposite plate 212.

The first plate 211 may be a substantially quadrangular plate having a first width W1 along a first direction and a first length L1 along a second direction perpendicular to (or crossing) the first direction. The first plate 211 may include first heat radiation pins 211p extending along a direction away from the second surface 100B of the display unit 100, that is, a third direction directed to the first opposite plate 212.

The first opposite plate 212 may have a substantially quadrangular plate having substantially the same size as that of the first plate 211, and include heat radiation pins 212p extending along the third direction directed to the first plate 211.

The pair of first side plates 213 and 214 may be disposed between the first plate 211 and the first opposite plate 212 to connect the first plate 211 with the first opposite plate 212, and may include heat radiation pins 213p and 214p extending toward a space formed between the first plate 211 and the first opposite plate 212.

The second heat radiation portion 220 is smaller than the first heat radiation portion 210 and is located inside the first heat radiation portion 210, and the heat radiation pins 212p, 213p, and 214p of the first heat radiation portion 210 directly contact the second heat radiation portion 220.

The second heat radiation portion 220 may include a second plate 221 parallel to the first plate 211, a second opposite plate 222 parallel to the second plate 221 to form a space between the second plate 221 and the second opposite plate 222, and a pair of second side plates 223 and 224 connecting the second plate 221 with the second opposite plate 222.

The second plate 221 may have a substantially quadrangular plate having a second width W2 along the first direction and a second length L2 along the second direction perpendicular to (or crossing) the first direction. The second width W2 of the second plate 221 may be less than the first width W1 of the first plate 211, and the second length L2 of the second plate 221 may be greater than the first length L1 of the first plate 211, so that a portion of the second heat radiation portion 220 may be exposed outside the first heat radiation portion 210 while the second heat radiation portion 220 is located inside the first heat radiation portion 210.

The second plate 221 may include second heat radiation pins 221p extending along a direction away from the second surface 100B of the display unit 100, that is, the third direction directed to the second opposite plate 222.

The second opposite plate 222 may be a substantially quadrangular plate having the substantially same size as that of the second plate 221, and include heat radiation pins 222*p* extending along the third direction directed to the second plate 221.

Though not shown, an outer surface of the second opposite plate 222, that is, an opposite surface of the inner surface on which the heat radiation pins 222*p* have been formed may include heat radiation pins or concave recesses and increase a surface area for heat radiation.

The pair of second side plates 223 and 224 may be disposed between the second plate 221 and the second opposite plate 222 to connect the second plate 221 and the second opposite plate 222, and may include heat radiation pins 223*p* and 224*p* extending toward a space formed between the second plate 221 and the second opposite plate 222.

As described with reference to FIGS. 3, 4, and 6, since the heat radiation member 200 includes the heat radiation portions (for example, the first and second heat radiation portions 210 and 220) the heat radiation member 200 may improve heat radiation efficiency by increasing an entire heat capacity of the heat radiation member 200.

Though the present exemplary embodiment has described the case where the heat radiation member 200 has a structure in which two heat radiation portions 210 and 220 overlap each other, the described technology is not limited thereto. The heat radiation member 200 may have a structure in which three or more heat radiation portions overlap each other.

The connection member 300 is provided on one side of the heat radiation member 200, and may improve heat radiation efficiency by thermally connecting the heat radiation member 200 and the metallic panel 5 (see FIG. 1) as described above. According to an exemplary embodiment, the connection member 300 is integrally formed with the first opposite plate 212.

Figure 7:
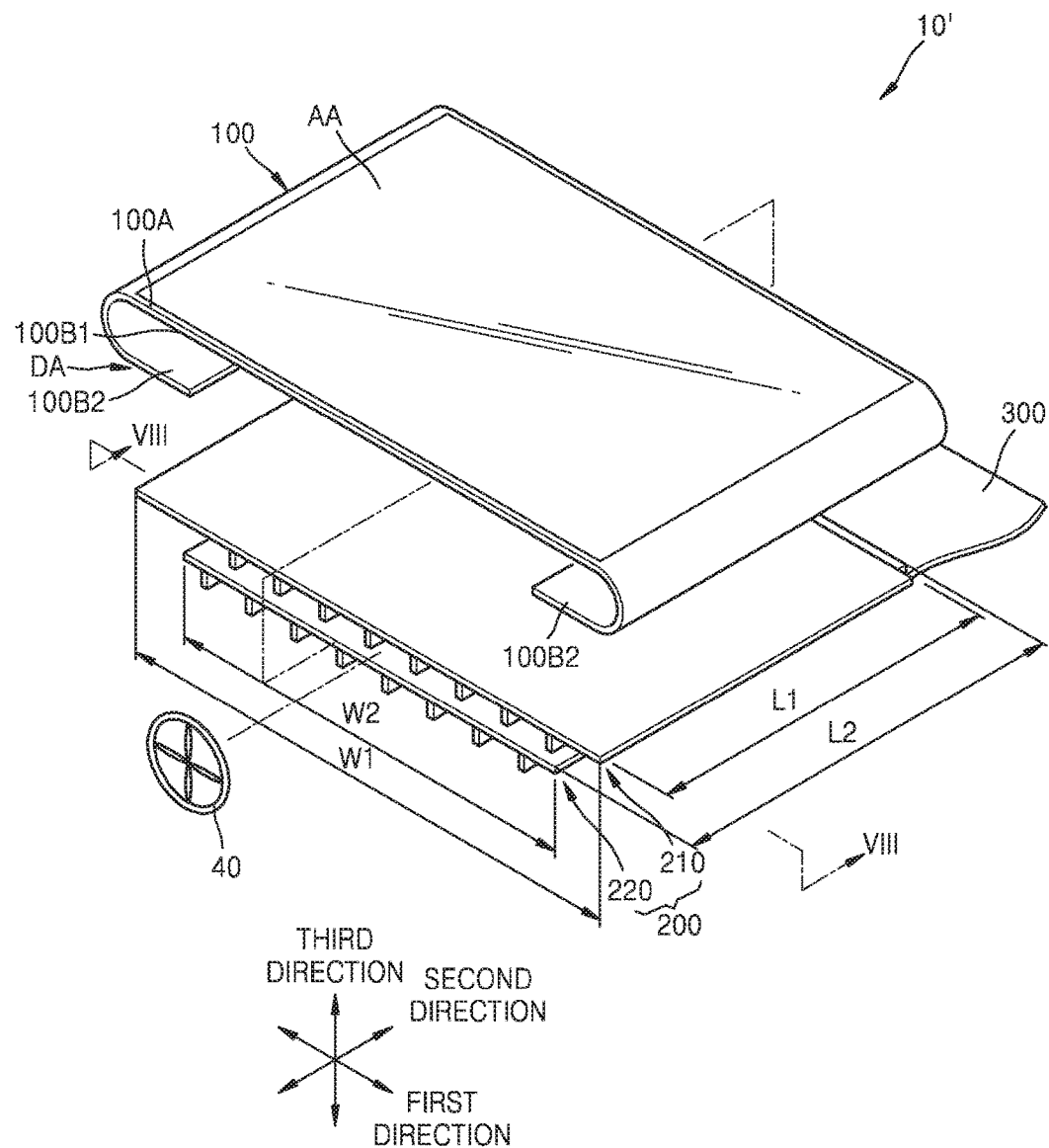
FIG. 7 is an exploded perspective view illustrating a display device for a vehicle according to another exemplary embodiment.
Figure 8:
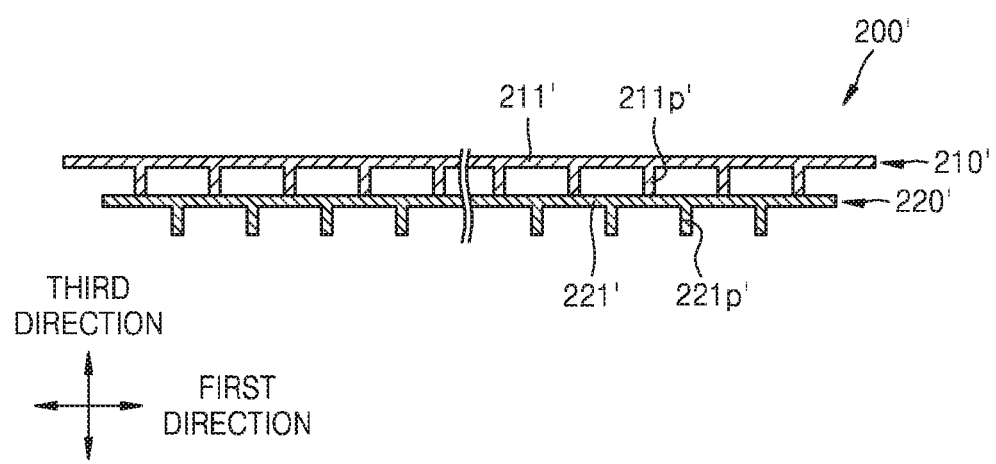
FIG. 8 is a cross-sectional view taken along a line VIII-VIII of FIG. 7.

FIG. 7 is an exploded perspective view illustrating a display device 10' for a vehicle according to another exemplary embodiment. FIG. 8 is a cross-sectional view taken along a line VIII-VIII of FIG. 7.

Referring to FIGS. 7 and 8, the display device 10' includes the display unit 100 and a heat radiation member 200'. The connection member 300 may be provided on one side of the heat radiation member 200'. Since the display unit 100 is the same as that described above, the heat radiation member 200' is mainly described below.

The heat radiation member 200' is thermally connected to the second surface 100B of the display unit 100. As described above, the heat radiation member 200' may directly contact the second surface 100B of the display unit 100, for example, the portion 100B 1 of the second surface 100B that corresponds to the active area AA, or may be thermally connected to the second surface 100B of the display unit 100 with a heat conductive adhesive layer (not shown) disposed therebetween. The heat radiation member 200' may be formed of a metallic material such as aluminum and silver, or an insulating material such as a heat conductive plastic.

The heat radiation member 200' may have a structure in which a plurality of heat radiation portions, that is, a first heat radiation portion 210' and a second heat radiation portion 220' overlap each other. For example, as illustrated in FIGS. 7 and 8, the heat radiation member 200' may have an overlapped structure in which the second heat radiation portion 220' is located below the first heat radiation portion 210'.

The first heat radiation portion 210' includes a first plate 211' facing the second surface 100B of the display unit 100. The first plate 211' may be an approximately quadrangular plate having the first width W1 along the first direction and the first length L1 along the second direction perpendicular to (or crossing) the first direction. The first plate 211' may include first heat radiation pins 211*p'* extending along a direction away from the second surface 100B of the display unit 100, that is, the third direction directed to the second opposite plate 220'.

The second heat radiation portion 220' includes a second plate 221' parallel to the first plate 211'. The second plate 221' may be a substantially quadrangular plate having the second width W2 along the first direction and the second length L2 along the second direction perpendicular to (or crossing) the first direction. The second width W2 of the second plate 221' may be less than the first width W1 of the first plate 211', and the second length L2 of the second plate 221' may be greater than the first length L1 of the first plate 211'.

The second plate 221' may include second heat radiation pins 221*p'* extending along a direction away from the second surface 100B of the display unit 100, that is, the third direction away from the first heat radiation portion 210'.

Since the heat radiation member 200' includes the heat radiation portions, for example, the first and second heat radiation portions 210' and 220', the heat radiation member 200' may improve heat radiation efficiency by increasing an entire heat capacity of the heat radiation member 200'. An air blower 40 may be disposed on one open side of the first and second heat radiation portions 210' and 220' to improve heat radiation efficiency.

Though the present exemplary embodiment has described the case where the heat radiation member 200' has a structure in which two heat radiation portions 210' and 220' overlap each other, the described technology is not limited thereto. The heat radiation member 200' may have a structure in which three or more heat radiation portions overlap each other.

The connection member 300 is provided on one side of the heat radiation member 200', and may improve heat radiation efficiency by thermally connecting the heat radiation member 200' with the metallic panel 5 (see FIG. 1) as described above. According to an exemplary embodiment, the connection member 300 may be integrally formed with the second plate 221'.

Figure 9:
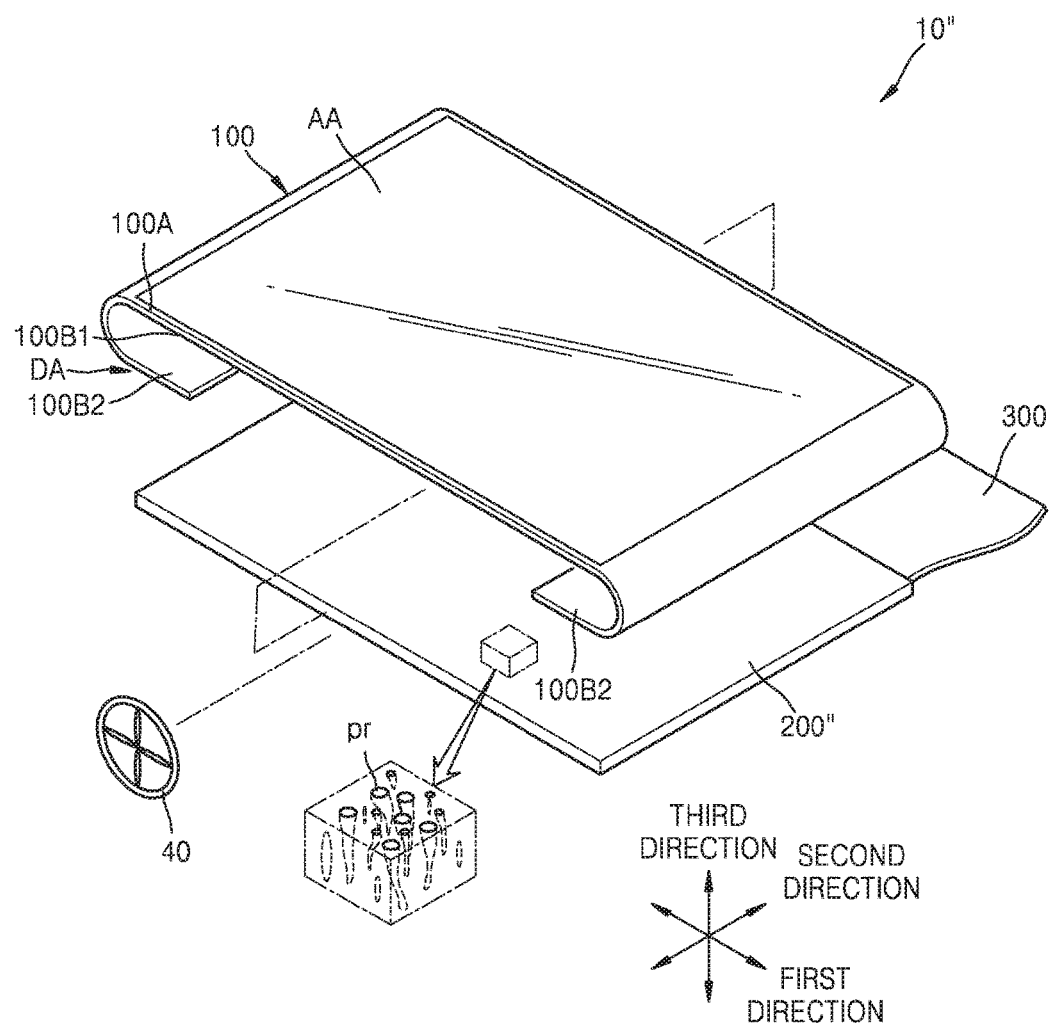
FIG. 9 is an exploded perspective view illustrating a display device for a vehicle according to another exemplary embodiment.

FIG. 9 is an exploded perspective view illustrating a display device 10" for a vehicle according to another exemplary embodiment.

Referring to FIG. 9, the display device 10" includes the display unit 100 and a heat radiation member 200". The connection member 300 may be provided on one side of the heat radiation member 200". Since the display unit 100 is the same as that described above, the heat radiation member 200" is mainly described below.

The heat radiation member 200" is thermally connected to the second surface 100B of the display unit 100. According to an exemplary embodiment, the heat radiation member 200" may directly contact the second surface 100B of the display unit 100, for example, the portion 100B 1 of the second surface 100B that corresponds to the active area AA. According to another exemplary embodiment, a heat conductive adhesive layer (not shown) may be further disposed between the heat radiation member 200" and the second surface 100B of the display unit 100, for example, the portion 100B 1 of the second surface 100B that corresponds to the active area AA.

Referring to an enlarged view of a portion of FIG. 9, the heat radiation member 200" may be a porous metallic plate including pores "pr" formed by porous etching or a process that uses a laser, etc. Since the porous metallic plate includes pores "pr", a portion of the volume of which is dispersed irregularly or regularly, the porous metallic plate has a wide surface area and an improved energy absorption capability compared a metallic plate with a material formed in bulk (e.g. a metallic plate without pores), so that heat radiation efficiency may improve.

The connection member 300 is provided on one side of the heat radiation member 200", and may improve heat radiation efficiency by thermally connecting the heat radiation member 200" with the metallic panel 5 (see FIG. 1) as described above. According to an exemplary embodiment, like the heat radiation member 200", the connection member 300 may be a porous metallic plate including pores.

Though the inventive technology has been described with reference to exemplary embodiments illustrated in the drawings, these are provided for an exemplary purpose only, and one of ordinary skill in the art will understand that various modifications and other equivalent embodiments may be made therein. Therefore, the spirit and scope of the inventive concept should be defined by the following claims.

What is claimed is:

1. A display device for a vehicle, the device comprising:
   a display unit comprising a first surface and a second surface located on an opposite side of the first surface, wherein the first surface includes i) an active area having opposing sides and configured to generate an image and ii) a plurality of inactive areas located on the opposing sides of the active area and bent with respect to the active area; and
   a heat radiation member adjacent to the second surface of the display unit and comprising a first heat radiation portion comprising:
      a first plate facing the second surface of the display unit and a plurality of first heat radiation pins that protrude from the first plate,
      a first opposite plate parallel to the first plate to form a first space between the first plate and the first opposite plate; and
      a pair of first side plates configured to connect the first plate and the first opposite plate.

2. The device of claim 1, wherein the heat radiation member further comprises
   a second heat radiation portion comprising a second plate parallel to the first plate and a plurality of second heat radiation pins that protrude from the second plate.

3. The device of claim 2, wherein the first and second heat radiation pins extending away from the second surface of the display unit.

4. The device of claim 2, wherein the first heat radiation pins directly contact the second plate.

5. The device of claim 1, wherein each of the first opposite plate and the pair of first side plates has an inner surface, and wherein the first heat radiation portion further comprises a plurality of heat radiation pins located on the inner surface of at least one of the first opposite plate and the pair of first side plates.

6. A display device for a vehicle, the device comprising:
   a display unit comprising a first surface and a second surface located on an opposite side of the first surface, wherein the first surface includes i) an active area having opposing sides and configured to generate an image and ii) a plurality of inactive areas located on the opposing sides of the active area and bent with respect to the active area; and
   a heat radiation member adjacent to the second surface of the display unit and comprising:
      a first heat radiation portion comprising a first plate facing the second surface of the display unit and a plurality of first heat radiation pins that protrude from the first plate, and
      a second heat radiation portion comprising:
         a second plate parallel to the first plate and a plurality of second heat radiation pins that protrude from the second plate;
         a second opposite plate parallel to the second plate to form a second space between the second plate and the second opposite plate; and
         a pair of second side plates configured to connect the second plate and the second opposite plate.

7. The device of claim 6, wherein each of the second opposite plate and the pair of second side plates has an inner surface, and wherein the second heat radiation portion further comprises a plurality of heat radiation pins located on the inner surface of at least one of the second opposite plate and the pair of second side plates.

8. A display device for a vehicle, the device comprising:
   a display unit comprising a first surface and a second surface located on an opposite side of the first surface, wherein the first surface includes i) an active area having opposing sides and configured to generate an image and ii) a plurality of inactive areas located on the opposing sides of the active area and bent with respect to the active area; and
   a heat radiation member adjacent to the second surface of the display unit,
   wherein the heat radiation member comprises:
      a first heat radiation portion comprising a first plate facing the second surface of the display unit and a plurality of first heat radiation pins that protrude from the first plate; and
      a second heat radiation portion comprising a second plate parallel to the first plate and a plurality of second heat radiation pins that protrude from the second plate,
   wherein the first plate has a first width defined along a first direction and a first length along a second direction different from the first direction, wherein the second plate has a second width defined along the first direction and a second length defined along the second direction, wherein the first width is greater than the second width, and wherein the first length is less than the second length.

9. The device of claim 1, wherein the heat radiation member comprises a porous metallic plate.

10. The device of claim 1, wherein the display unit comprises a flexible organic light-emitting diode display.

11. An automobile comprising:
    a car body defining an indoor space; and
    a display device formed in the indoor space,
    wherein the display device comprises:
       a display unit comprising a first surface and a second surface located on an opposite side of the first surface, wherein the first surface includes an i) active area having opposing sides and configured to generate an image and ii) a plurality of inactive areas located on the opposing sides of the active area and bent with respect to the active area; and
       a heat radiation member adjacent to the second surface of the display unit,
    wherein the car body further comprises i) a front portion defining a part space spatially separated from the indoor space and ii) a metallic panel included in the part space, and wherein the heat radiation member is thermally connected to the metallic panel.

12. The automobile of claim 11, further comprising a dashboard in the indoor space, wherein the display device is located on the dashboard.

13. The automobile of claim 11, wherein the heat radiation member comprises:
a first heat radiation portion comprising a first plate facing the second surface of the display unit and a plurality of first heat radiation pins that protrude from the first plate; and
a second heat radiation portion comprising a second plate parallel to the first plate and a plurality of second heat radiation pins that protrude from the second plate,
wherein the first heat radiation pins directly contact the second plate.

14. The automobile of claim 13, wherein the first heat radiation portion further comprises:
a first opposite plate parallel to the first plate to form a first space between the first plate and the first opposite plate; and
a pair of first side plates configured to connect the first plate and the first opposite plate, and
wherein the second heat radiation portion further comprises:
a second opposite plate parallel to the second plate to form a second space between the second plate and the second opposite plate; and
a pair of second side plates configured to connect the second plate and the second opposite plate.

15. The automobile of claim 14, wherein each of the first opposite plate and the pair of first side plates has an inner surface, and wherein the first heat radiation portion further comprises a plurality of heat radiation pins located on the inner surface of at least one of the first opposite plate and the pair of first side plates.

16. The automobile of claim 14, wherein each of the second opposite plate and the pair of second side plates has an inner surface, and wherein the second heat radiation portion further comprises a plurality of heat radiation pins located on the inner surface of at least one of the second opposite plate and the pair of second side plates.

17. The automobile of claim 11, further comprising an air blower configured to control a flow speed of air passing through the heat radiation member.

18. The automobile of claim 11, wherein the heat radiation member comprises a porous metallic plate.

* * * * *